Figure 1:
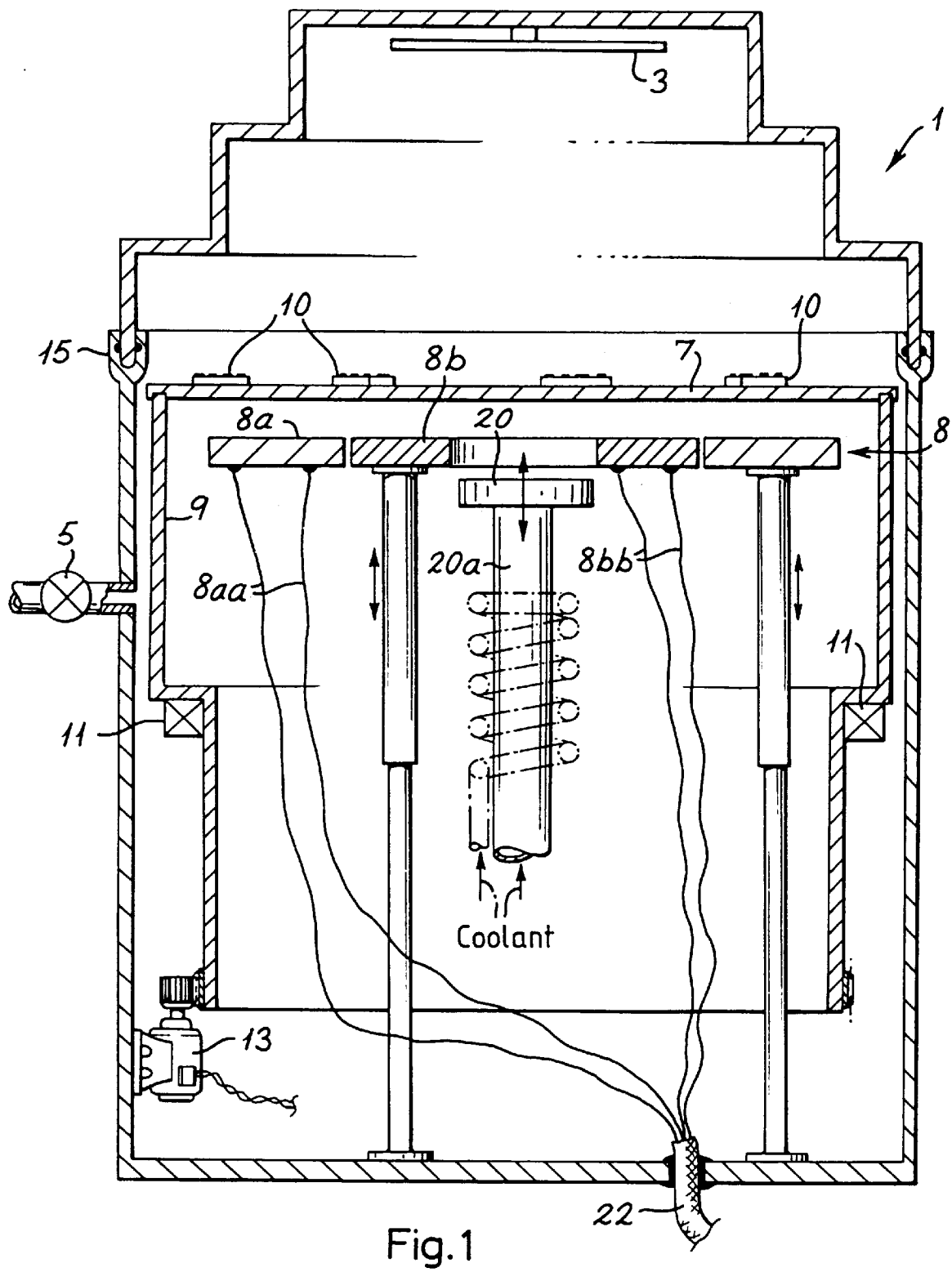

United States Patent [19]
Baxendine

[11] Patent Number: 5,859,408
[45] Date of Patent: Jan. 12, 1999

[54] APPARATUS FOR UNIFORMLY HEATING A SUBSTRATE

[75] Inventor: Alan Richard Baxendine, East Sussex, England

[73] Assignee: BTG International Limited, London, England

[21] Appl. No.: 782,898

[22] Filed: Dec. 27, 1996

Related U.S. Application Data

[63] Continuation of PCT/GB95/01469 Jun. 22, 1995.

[30] Foreign Application Priority Data

Jun. 28, 1994 [GB] United Kingdom ............... 9412918

[51] Int. Cl.$^6$ ............... H01L 21/02; H05B 3/22; F27B 5/14
[52] U.S. Cl. ............... 219/390; 118/724; 118/728; 392/418; 438/799
[58] Field of Search .............. 219/390, 405, 219/411, 464–466; 118/50.1, 724, 725, 728–730; 250/492.2, 492.22; 392/416, 418; 165/61; 427/557, 559; 432/77, 87; 438/795, 799

[56] References Cited

U.S. PATENT DOCUMENTS

| | | |
|---|---|---|
| 4,609,037 | 9/1986 | Wheeler et al. ............ 165/61 |
| 4,859,832 | 8/1989 | Uehara et al. . |
| 5,044,943 | 9/1991 | Bowman et al. . |
| 5,050,770 | 9/1991 | Mahawili . |
| 5,059,770 | 10/1991 | Mahawili . |
| 5,091,217 | 2/1992 | Het et al. ............ 118/725 |
| 5,338,940 | 8/1994 | Takeyama ............ 250/492.2 |
| 5,635,093 | 6/1997 | Arena et al. ............ 219/466 |

FOREIGN PATENT DOCUMENTS

| | | |
|---|---|---|
| 108206 | 5/1984 | European Pat. Off. . |
| 223966 | 6/1987 | European Pat. Off. . |
| 476 307 | 3/1992 | European Pat. Off. . |
| 476307 | 3/1992 | European Pat. Off. . |
| 03-069111 | 3/1991 | Japan . |
| 04-199811 | 7/1992 | Japan . |
| 472528 | 9/1937 | United Kingdom . |
| 1498787 | 1/1978 | United Kingdom . |
| 2038623 | 7/1980 | United Kingdom . |
| 2213316 | 8/1989 | United Kingdom . |
| 2281448 | 3/1995 | United Kingdom . |

OTHER PUBLICATIONS

"Organo–metal CVD Device," Jananese patent document 'A' abstract w/figure, #05–221790, Aug. 1993.

Primary Examiner—Teresa J. Walberg
Assistant Examiner—J. Pelham
Attorney, Agent, or Firm—Pillsbury Madison & Sutro LLP

[57] ABSTRACT

Support 7 is uniformly heated from underneath by an annular heater 8 having a vertically adjustable cooling disc 20 in the middle. This arrangement gives a very uniform temperature profile diametrically across the top of the support 7, useful in the production of semiconductor components 10 which are consistently heat treated wherever they are placed on the support 7.

Support 7 is rotated and may be subjected to microwave irradiation from an overhead generator 3.

16 Claims, 2 Drawing Sheets

APPARATUS FOR UNIFORMLY HEATING A SUBSTRATE

This is a Continuation of International Appln. No. PCT/GB95/01469 filed Jun. 22, 1995 which designated the U.S.

This invention relates to apparatus for uniformly heating a substrate in a controlled atmosphere. Such apparatus can find application in, for example, the semiconductor industry, where chips in the course of manufacture may need to be subjected to a highly controlled heat treatment in a vacuum or a low gas pressure for plasma treatment, plasma etching, doping or like manipulations, or indeed under superatmospheric pressure.

It is known to provide a flat circular platen, optionally rotatable on its axis, on which platen there are placed "substrates" (e.g. semiconductor chips) for heat treatment. Underneath the platen is mounted a flat spiral electric-resistance radiant heater concentric with and parallel to the platen and spaced about 0.05 to 0.3 diameters from it. However carefully such apparatus is set up, it gives an uneven temperature distribution across the platen, typically 200° C. warmer in the centre than at the edge. Such apparatus is unsatisfactory for the additional reason that very high currents must be fed into the heater, and costly and inconvenient current-handling and control arrangements are necessary.

In an attempt to overcome this, U.S. Pat. No. 5,059,770 modifies the heater underneath into three concentric annular heaters, each heater having its own (more modest) current feeder arrangements, the current to each heater being controlled independently through separate feedback thermocouples.

According to the present invention, apparatus for uniformly heating a substrate in a controlled atmosphere comprises a circular support for the substrate and, underneath or above the support and concentric with and parallel thereto, an annular radiant heater, characterised by a cooled disc within the central circle of the annulus. The central circle, i.e. inner diameter of the annulus, is preferably from 25 to 75%, more preferably 30 to 70%, desirably 40 to 60%, of the outer diameter of the annulus.

The annular heater may itself consist of two or more annuli, each preferably with separate current feeders and controls.

Chips or other substrates would be placed on the support for heat treatment.

Supplementary heating, for example by plasma energy and/or microwaves, may be applied downwards onto the support and onto any substrate (such as chips) thereon. While it is implicit from this that the usual arrangement would be to place the heater(s) underneath the support, the whole may be inverted, with the top of the support (and any substrate thereon) being exposed to the annular radiant heater(s).

The central circle of the annulus is occupied by a cooled disc, which may be axially adjustable. The annular heater(s) may be fixed or independently axially adjustable.

The support may be rotatable on its axis.

Preferably, the cooled disc extends radially outwardly to at least partially overlap the annular radiant heater, it may be cooled by heat-transfer-fluid-conduits therein, and it preferably has a flat surface for supporting the substrate.

Alternatively, the cooled disc may have sealing means co-operable with an intended substrate to define a cavity in which heat transfer fluid can contact the back of the substrate.

The cooled disc may have an axial mount containing conduits for heat transfer fluid.

The support may be exposed to microwave radiation from above with an annular gap between the substrate and the chamber edge, the gap acting as a microwave choke and hence preferably being 2% or less of the substrate diameter.

The microwave energy can induce a plasma.

Figure 2:
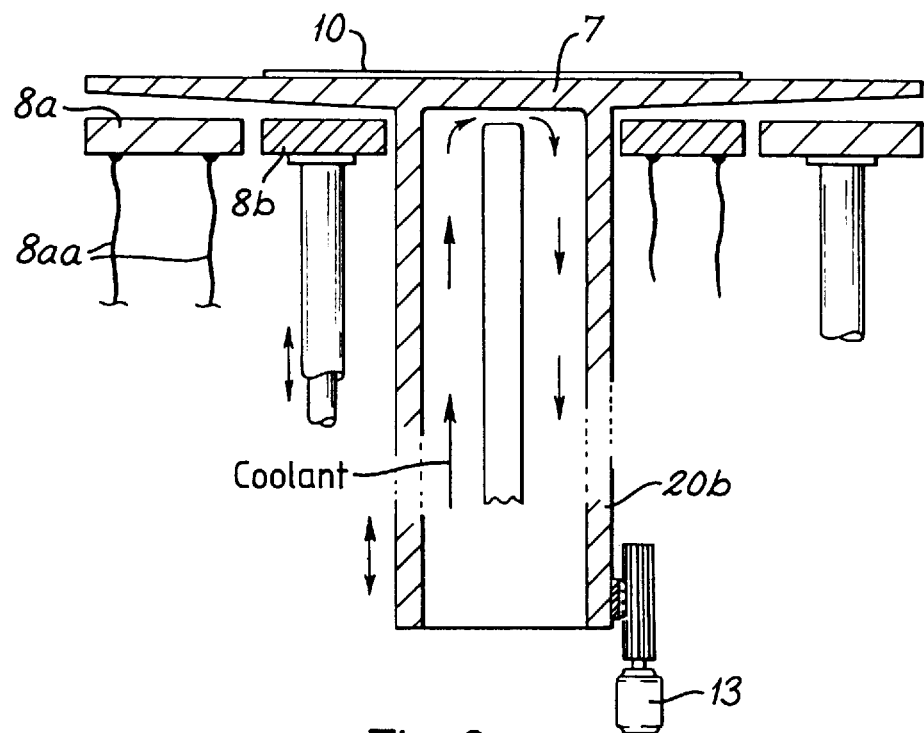
Figure 3:
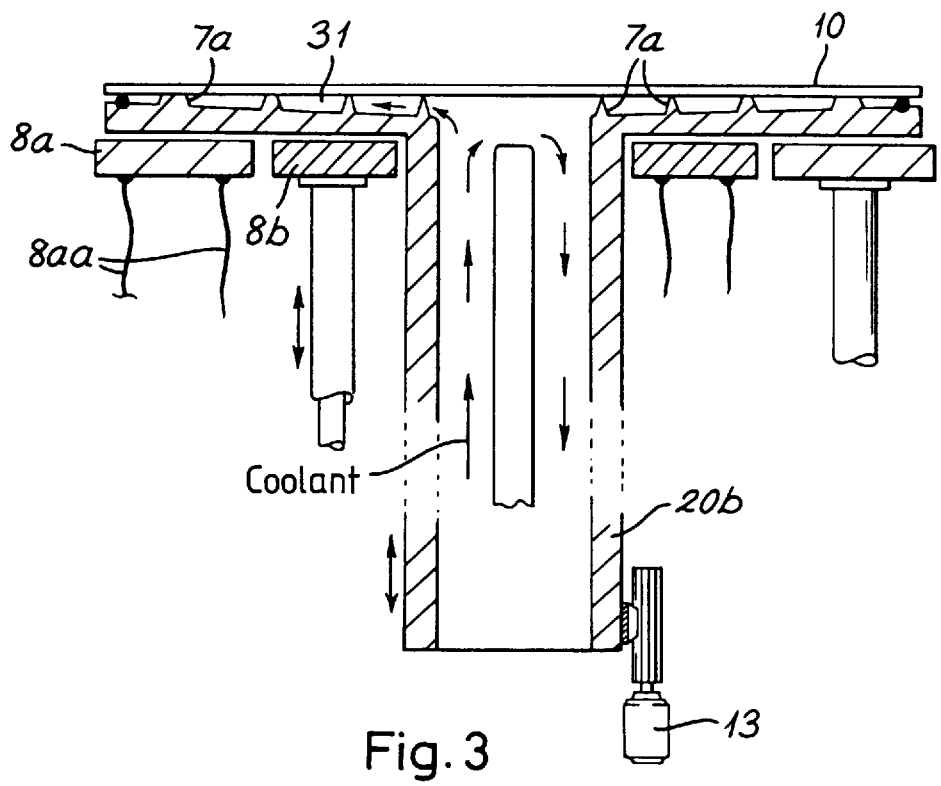

The invention will now be described by way of example with reference to the accompanying drawings, in which FIG. 1 is a schematic cut-away elevation of an embodiment of apparatus (including a cooler and support) according to the invention, and FIGS. 2 and 3 show variants, also according to the invention, of the cooler and support.

Corresponding parts have the same reference numeral in each Figure.

In the FIG. 1 embodiment, a gas-tight chamber 1 for uniformly heating a substrate (and semiconductor chips on the substrate) has a microwave generator 3 in the roof of the chamber and a port 5 to evacuation pumps and/or pure gas supplies.

Within the chamber, a flat circular support in the form of a platen 7 is provided, with a depending cylindrical skirt 9 clearing the wall of the chamber 1 by 2 mm or less, which is about 1% of the diameter of the chamber. In use, semiconductor chips or other substrate 10 to be heat-treated are placed on the platen 7. The skirt 9 is held in bearings 11 to permit rotation of the platen 7 about its vertical axis. The bearings 11 are unlubricated, to avoid contamination of the substrate 10 by oil vapour when the chamber is evacuated and/or heated. Drive means 13 such as an electric motor rotate the platen at a modest rate such as 120 rpm.

The electric motor may be replaced by alternative drive means 13 adapted for rotating an object within a sealed vessel, such as are described in for example U.S. Pat. No. 3,435,128, European Patent 0108206, British Patent GB 2213316 or UK Patent Application 9317954.7.

The 2 mm clearance referred to above, between the skirt 9 and the chamber 1, acts as a microwave choke protecting the contents of the lower part of the chamber from microwave radiation.

Underneath the platen 7 is a two-part annular electric resistance heater 8 coaxial with the substrate. The outer part 8a, though shown as a block for simplicity, is a spiral-type-shaped resistance element. The inner part 8b is the same. Each part has its own independent current feeders shown schematically as 8aa and 8bb, the currents through which are independently regulated according to the output of thermocouples or optical pyrometers sensing suitable radially spaced locations on the platen 7. The outer diameter of 8a and the inner diameter of 8b in one example are 125 mm and 70 mm, and in another example are 240 mm and 125 mm.

The heater parts 8a and 8b are independently supported on insulating rods which permit the heights of 8a and 8b to be adjusted independently although it will frequently be found optimal for their heights to be equal, as shown.

In use, the chamber 1 is opened by breaking a hermetic seal 15 and lifting off the upper part of the chamber, then substrate components 10 are placed on the platen 7, the chamber is resealed, and the appropriate atmosphere at the required pressure is established via the port 5. The platen 7 is set in rotation at 120 rpm through the drive means 13 and current is applied through the feeders 8aa and 8bb to yield a flat temperature profile (of typically 940° C.) across the top of the platen 7. The chip components 10 are optionally etched by plasma induced by microwave irradiation from the generator 3. The substrate components 10 enjoy consistent heat treatment wherever they happen to be located on the platen 7, and this is an important production advantage.

Optionally, the empty centre of the annular heater 8 may be occupied by a cooling disc 20, which is also height-adjustable along the common axis of the chamber, platen and heater. The disc 20 may be cooled through a heat pipe 20*a* on which it is mounted, the lower end of the heat pipe being surrounded by coils through which cooling medium flows, or the mount 20*a* may contain conduits through which cooling medium, such as water or high-boiling oil, flows. The rate of flow of the cooling medium, the cooled temperature of the medium and the proximity of the disc 20 to the platen 7 are all independently variable by trial and error to assist in obtaining the flattest possible temperature profile across the diameter of the platen 7.

The cooling medium, the current feeders 8aa and 8bb, the supply to the drive means 13 and any other services, for example thermocouple leads and power supplies to vertical positioning motors for the heater parts 8*a* and 8*b* and cooling disc 20, all pass into the chamber 1 through a static hermetic seal 22.

Turning to FIG. 2, a modification of the FIG. 1 embodiment is shown. In the modification, the two-part annular electric resistance heater 8 (8*a*, 8*b*) is unchanged but the cooled disc 20 and the platen 7 are combined. A hollow flanged mount 20*b* with channels for coolant is formed with the flange at its upper end forming an integral circular platen 7 of similar diameter to the heater part 8*a*. The platen 7 is cooled by conduction radially inwardly to the cooled mount 20*b*. If desired, channels for coolant may be formed within the thickness of the platen 7 located peripherally of the mount 20*b*. The size and disposition of such channels is such that, in combination with a suitable flow rate and inlet temperature (independently controllable) of a suitable coolant such as an oil, coupled with suitable independently regulated heating currents supplied to 8*a* and 8*b*, and with appropriate vertical (axial) adjustments of 8*b* and 20*a*, the upper surface of the platen 7 is at an acceptably uniform temperature at all points.

In use, one or more substrates 10 to be treated are placed on the platen 7, the chamber 1 is sealed and evacuated, the platen is set in rotation by a drive 13 applied to the mount 20*b*, and so on as described for FIG. 1. The platen 7 may be flat-topped, to receive any substrates 10, or may be customised with features such as recesses or locating ribs to hold specific substrates in a desired place and orientation, as may be desired for automated handling.

Turning to FIG. 3, an embodiment of the invention is shown which closely resembles FIG. 2. However, the platen 7, cooled this time by an inert gas supplied to the coolant channels in the hollow mount 20*b*, lacks internal cooling channels in the flange part, but is instead formed to receive a specific design of substrate 10. (When it was intended to manufacture a different substrate 10, a new plant would be designed for the purpose.)

The platen 7 is provided circumferentially with a gas seal 30 which co-operates with the specific substrate 10 to enclose a volume schematically shown as 31, in direct communication with the coolant channels in the mount 20*b*. The volume 31 is defined jointly by the back of the substrate 10 and the upper surface of the platen 7 and may take the form of a simple cylinder or may (as schematically shown) be of more complex shape such as deepening towards the centre, optionally with support points 7*a* where the substrate 10 actually sits on the platen 7. The design of the volume 31 may exploit the centrifugal-pump effect of rotating the platen 7 from the drive 13.

In this way, most or all of the back of the substrate 10 is cooled by direct contact with the gas supplied via 20*b*, and this compensates for any irregularities in the heating profile from 8*a* and 8*b* after the various adjustments which are possible. The seal 30 need not be totally perfect, if the inert coolant gas is acceptable up to certain pressures on the front (=the face to be treated) of the substrate 10.

I claim:

1. An apparatus for uniformly heating a substrate in a controlled atmosphere, comprising a circular support for the substrate and, underneath or above the support and concentric with and parallel thereto, an annular radiant heater, and cooling means for cooling a central portion of said support disposed within the central circle of the annulus.

2. The apparatus according to claim 1, wherein the inner diameter of the annulus is from 25 to 75% of its outer diameter.

3. The apparatus according to claim 2, wherein the inner diameter of the annulus is from 30 to 70% of its outer diameter.

4. The apparatus according to claim 3, wherein the inner diameter of the annulus is from 40 to 60% of its outer diameter.

5. The apparatus according to claim 1, 2, 3 or 4, wherein the spacing between the annular radiant heater and the support is adjustable.

6. The apparatus according to claim 1, wherein the annular heater consists of two or more annular heaters.

7. The aparatus according to claim 6, wherein the heaters are independently axially adjustable.

8. The apparatus according to claim 1, wherein the support is rotatable with respect to the heater about its axis.

9. The apparatus according to claim 1, wherein the cooling means is axially adjustable.

10. The apparatus according to claim 1, wherein the cooling means includes a disc extending radially outwardly to at least partially overlap the annular radiant heater.

11. The apparatus according to claim 10, wherein the disc has heat-transfer-fluid-conduits therein for cooling the disc in use.

12. The apparatus according to claim 1, wherein the cooling means has a flat surface for supporting the substrate.

13. The apparatus according to claim 11, wherein the cooling means includes sealing means co-operable with an intended substrate to define a cavity in which, in use, heat transfer fluid can contact the back of the substrate.

14. The apparatus according to claim 1, wherein the cooling means includes an axial mount containing conduits for heat transfer fluid.

15. The apparatus according to claim 1, further comprising a chamber having an edge, wherein the support is disposed in the chamber, wherein the support is exposed to microwave radiation from above, with an annular gap between the support and the chamber edge of 2% or less of the support diameter.

16. A method of heat treating a substrate in a controlled atmosphere, comprising placing the substrate on the support of apparatus according to claim 1, setting any axially adjustable components, activating the heater and cooling means, and optionally rotating the substrate.

* * * * *